United States Patent

Saxena

[15] 3,700,979

[45] Oct. 24, 1972

[54] SCHOTTKY BARRIER DIODE AND METHOD OF MAKING THE SAME

[72] Inventor: Arjun Nath Saxena, Princeton, N.J.

[73] Assignee: RCA Corporation

[22] Filed: April 7, 1971

[21] Appl. No.: 131,955

[52] U.S. Cl.....317/235 R, 317/234 M, 317/235 UA, 29/590

[51] Int. Cl............................H01l 11/00, H01l 15/00

[58] Field of Search.......317/234 M, 234 N, 235 UA; 29/589, 590, 591, 183.5

[56] References Cited

UNITED STATES PATENTS

| | | | |
|---|---|---|---|
| 3,604,986 | 9/1971 | Lepselter | 317/235 UA |
| 3,616,380 | 10/1971 | Lepselter | 317/235 UA |
| 3,349,297 | 10/1967 | Crowell et al. | 317/234 |
| 3,599,323 | 8/1971 | Saxena | 317/235 X |
| 3,649,890 | 3/1972 | Howell et al | 317/235 |

*Primary Examiner*—John W. Huckert
*Assistant Examiner*—Andrew J. James
*Attorney*—Glenn H. Bruestle

[57] ABSTRACT

A Schottky barrier diode diode including a body of P type single crystalline silicon and a film of hafnium on a surface of the body and forming a surface barrier rectifying junction with the body. The diode has a barrier height of approximately 0.90 electron volts.

4 Claims, 1 Drawing Figure

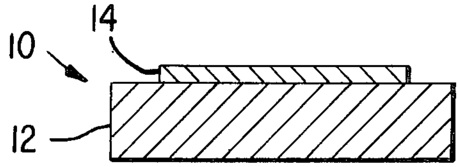
INVENTOR.
ARJUN N. SAXENA
BY
Donald S. Cohen
ATTORNEY

SCHOTTKY BARRIER DIODE AND METHOD OF MAKING THE SAME

BACKGROUND OF THE INVENTION

The present invention relates to a Schottky barrier diode and more particularly to a Schottky barrier diode having a high barrier height and a method of making the diode.

A Schottky barrier diode is a semiconductor diode having a metal to semiconductor material surface barrier rectifying junction. Such diodes generally comprise a metal film coated directly on the surface of a body of a semiconductor material. A characteristic of a Schottky barrier diode which affects certain operating properties of the diode, such as the leakage current and turn-on voltage, is the Schottky barrier height. The schottky barrier height is the distance in electron volts between the Fermi level and the conduction band of the semiconductor material of the diode at the metal to semiconductor surface barrier junction. The greater the Schottky barrier height the lower the leakage current and the higher the turn-on voltage.

Heretofore, Schottky barrier diodes made with N type conductivity semiconductor materials had a Schottky barrier height much greater than such diodes made with P type conductivity semiconductor material. For example, using single crystalline silicon as the semiconductor material, the highest reported Schottky barrier height for N type conductivity silicon is about 0.85 electron volts and the highest reported Schottky barrier height for P type conductivity silicon is about 0.45 electron volts. Because of this great difference between the Schottky barrier heights of N type and P type semiconductor materials, Schottky surface barrier diodes have been generally made with the N type semiconductor materials to take advantage of the improved operating performance that the higher Schottky barrier height provides. This, in turn, has often limited the use of the Schottky surface barrier diode.

SUMMARY OF THE INVENTION

A semiconductor diode including a body of P type conductivity semiconductor material having a metal film on a surface of the body and forming a surface barrier rectifying junction with the body. The film is of a metal which provides a barrier height of approximately 0.90 electron volts.

BRIEF DESCRIPTION OF DRAWING

The FIGURE of the drawing is a sectional view of a form of the Schottky surface barrier diode of the present invention.

DETAILED DESCRIPTION

Referring to the figure of the drawing, a form of the Schottky surface barrier diode of the present invention is generally designated as 10. The Schottky surface barrier diode comprises a body 12 of P type conductivity single crystalline silicon having a metal film 14 of hafnium on a surface thereof. The hafnium film 14 is formed on the surface of the silicon body 12 so as to provide a surface barrier rectifying junction with the body.

I have found that the Schottky surface barrier diode 10 formed by the hafnium film 14 on the P type conductivity single crystalline silicon body 12 has a Schottky barrier height of approximately 0.90 electron volts. Thus, the hafnium - P type conductivity silicon Schottky surface barrier diode 10 has a Schottky barrier height which is exceedingly higher than that of any previously reported Schottky surface barrier diode made with P type conductivity semiconductor material. In fact, the hafnium - P type conductivity silicon Schottky surface barrier diode 10 has a Schottky barrier height which is as high as, and in fact slightly higher than that of any previously reported Schottky surface barrier diode made with N type conductivity semiconductor material. Thus, the Schottky surface barrier diode 10 of the present invention has leakage current and turn-on voltage characteristics which are considerably better than any previously reported Schottky surface barrier diode made with P type conductivity semiconductor material and which are as good as any previously reported Schottky surface barrier diode made with N type conductivity semiconductor material. Since the Schottky surface barrier diode 10 of the present invention permits the formation of such diodes in P type semiconductor material which have characteristics complementary to Schottky surface barrier diodes formed with N type semiconductor materials, many of the limitations in the use of such diodes are eliminated.

The Schottky surface barrier diode 10 of the present invention can be made by first cleaning the surface of a body of P type conductivity single crystalline silicon. The silicon body can be cleaned using any well-known technique for removing spurious layers and contaminants from the body. One such technique includes immersing the body first into trichloroethylene and then into acetone. After washing the body with de-ionized water, the body is then immersed into sulfuric acid followed by an immersion in nitric acid. Again, after washing the body with de-ionized water, the body is immersed into a 10 percent solution of hydrofluoric acid for about one minute. After a final washing of the body with de-ionized water, the body is then sufficiently clean to apply the hafnium film to a surface of the body. The hafnium film can be coated on a surface of the body by either of the well-known techniques of sputtering in a partial vacuum or electron beam evaporation in a vacuum. The hafnium film is then annealed in an atmosphere of dry helium at a temperature of between 450° C and 550° C. This provides the Schottky surface barrier diode 10 of the present invention which has a Schottky barrier height of approximately 0.90 electron volts.

I claim:

1. A semiconductor diode comprising
   a body of P type conductivity silicon semiconductor material having a surface,
   a hafnium metal film on said surface and forming a surface barrier rectifying junction with said body, said film being of a metal which provides a barrier height of approximately 0.90 electron volts.

2. A method of making a Schottky surface barrier diode comprising coating at least a portion of a surface of a body of P type silicon semiconductor material with a film of hafnium metal to provide a surface barrier rectifying junction between said film and the body.

3. The method of claim 2 including the step of annealing the hafnium film in an atmosphere of dry helium at a temperature of between 450° C and 550° C.

4. The method of claim 3 including the step of cleaning the surface of the body prior to coating the surface with the hafnium film.

* * * * *